United States Patent
Ojha

[11] Patent Number: 5,979,188
[45] Date of Patent: Nov. 9, 1999

[54] METHOD OF FABRICATING A PLANAR WAVEGUIDE STRUCTURE

[75] Inventor: Sureshchandra Mishrilal Ojha, Harlow, United Kingdom

[73] Assignee: Northern Telecom Limited, Montreal, Canada

[21] Appl. No.: 08/880,594

[22] Filed: Jun. 23, 1997

[30] Foreign Application Priority Data

Jun. 22, 1996 [GB] United Kingdom .................... 9613153

[51] Int. Cl.[6] .................................................. C23C 16/40
[52] U.S. Cl. ................... 65/386; 65/391; 65/413; 427/163.2; 427/579; 427/376.2; 427/379
[58] Field of Search .................. 427/163.2, 166, 427/167, 376.2, 379, 248.1, 255, 579, 255.37; 65/386, 391, 413, 426, 430

[56] References Cited

U.S. PATENT DOCUMENTS 3,868,170  2/1975  DeLuca ..................................... 350/96

FOREIGN PATENT DOCUMENTS 2292468  2/1996  United Kingdom .

*Primary Examiner*—Timothy Meeks
*Attorney, Agent, or Firm*—Lee, Mann, Smith, McWilliams, Sweeney & Ohlson

[57] ABSTRACT

Annealing a planar wave guide layer is critical because small structural imperfections lead to optical problems. Chemical vapor deposition of the layer tends to leave gaseous substances bonded to the deposit, which on being driven off by initial annealing warm-ups leave cavities requiring densification. Traditional annealing methods take several hours. This invention proposes a rapid heating of the layer to a temperature below the flow temperature, maintaining this temperature for about 30 to 300 seconds, then rapidly heating up further to a temperature close to or above the flow temperature, maintaining this temperature for about 30 to 300 seconds, then allowing the substrate and layer to cool rapidly to room temperature.

4 Claims, 3 Drawing Sheets

METHOD OF FABRICATING A PLANAR WAVEGUIDE STRUCTURE

The present invention relates to a method for annealing a planar wave guide structure and to a method of fabricating such a structure.

BACKGROUND OF THE INVENTION

Planar optical wave guides typically comprise a buffer or so-called undercladding layer deposited on a silicon substrate. This buffer layer may be silicon oxide, undoped or doped with one or more of boron, phosphorus and germania. Deposited on the buffer layer is a core layer, also typically of doped silicon oxide. There may be a stress compensating oxide layer deposited on the underside of the substrate, to counteract any tendency of the oxides on top to cause thermal or other distortions. Optical signals are contained within the core layer by a lower refractive index arranged for the surrounding buffer and a cladding layer deposited on the core layer.

In such an arrangement, the cladding layer is generally deposited by a chemical vapour deposition process, typically plasma enhanced chemical vapour deposition. The material is deposited in a form that requires consolidation into a coherent vitreous composition and this is effected by an annealing process. A particular problem with current annealing processes is the excessive time, typically several hours, required for their completion to provide a dense uniform material. It was previously considered necessary to raise the temperature to the annealing temperature at a very slow rate to avoid the risk of cracking and consequent degradation of the deposited cladding layer. This in turn impairs the optical properties of the wave guide core. It is believed that this cracking of the cladding layer results from voids or imperfections that are left from the evolution of bonded volatile materials, particularly hydrogen, that are present in the deposited material prior to the annealing process. The need for long annealing times has made these devices relatively costly to manufacture and has thus restricted their general use.

SUMMARY OF THE INVENTION

It is an object of the invention to minimise or to overcome this disadvantage.

It is a further object of the invention to provide an improved process for annealing planar optical device structures.

According to the invention there is provided a method of thermal annealing a planar wave guide layer comprising a vitreous material which has been deposited by chemical vapour deposition on a substrate, the method including the steps of heating the layer to a first temperature below the flow temperature of the layer in a pre-annealing step and maintaining the layer at said first temperature for a time period sufficient to drive off bonded volatile materials from the layer, and subsequently heating the layer to a second temperature close to or above the flow temperature of the layer in a final heating step so as to effect densification of the layer, and allowing the layer to return to ambient temperature.

According to another aspect of the invention there is provided a method of fabricating a planar wave guide structure, the method comprising:

forming an oxide buffer layer on a major surface of a silicon wafer substrate;

forming at least one optical wave guide cores on said buffer layer, said core being doped to increase its refractive index above that of said buffer layer:

depositing a cladding layer over said core(s) and buffer layer so as to provide a substantially planar surface, said buffer layer having a refractive index less than that of said core(s); and annealing the structure including the cladding layer by heating the structure to a first temperature below the flow temperature of the cladding layer in a pre-annealing step long enough to drive off bonded volatile materials from the cladding layer, and subsequently quickly heating the structure to a second temperature close to or above the flow temperature of the cladding layer in a final heating step so as to consolidate the cladding layer, and allowing the structure to return to a ambient temperature.

In a further embodiment, the invention is concerned with annealing the buffer layer, or annealing both this and the core layer, before the cladding layer is deposited. The buffer layer may be deposited by PECVD (plasma enhanced chemical vapour deposition), LPCVD (low pressure chemical vapour deposition), in which heating rather than plasma enhancement ionise the chemicals, or by thermal oxidation at elevated temperatures such as 1100° in steam. If thermal oxidation in stream is used to form the buffer layer, then annealing of this layer may not be necessary. The core layer is best produced by PECVD or LPCVD as aforesaid.

The invention aims to reduce annealing times, which by many prior art proposals could amount to several hours, and to improve the effective optical quality of wave guide structures by appropriate annealing of the core, or of the core and the buffer. Specifically, the use of a two stage process in which the first stage eliminates volatile materials and the second stage provides densification significantly reduces the total time required to provide effective annealing.

A feature of the embodiments is to heat the core, or the core and buffer layers, to close to or above the flow temperature, e.g. to a temperature of 1150°–1250° C. for a period of from 30 to 300 seconds, for achieving satisfactory densification of the layers. Prior to the densification step, the layers are preheated at temperatures below the flow temperature of the materials, e.g. at from 840° C. to 930° C. for about 30 to 300 seconds in a pre-annealing step in order to drive off bonded hydrogen or other volatile materials. The bonded hydrogen arises due to the chemical vapour deposition process. The driving out of the hydrogen in the pre-annealing step creates density defects such as cavities or voids. Thus the subsequent annealing close to or above flow temperatures repairs these defects so as to bring about a necessary densification of the material.

BRIEF DESCRIPTION OF THE DRAWINGS

Embodiments of the invention will now be described with reference to the accompanying drawings, in which.

DESCRIPTION OF PREFERRED EMBODIMENT

Figure 1:
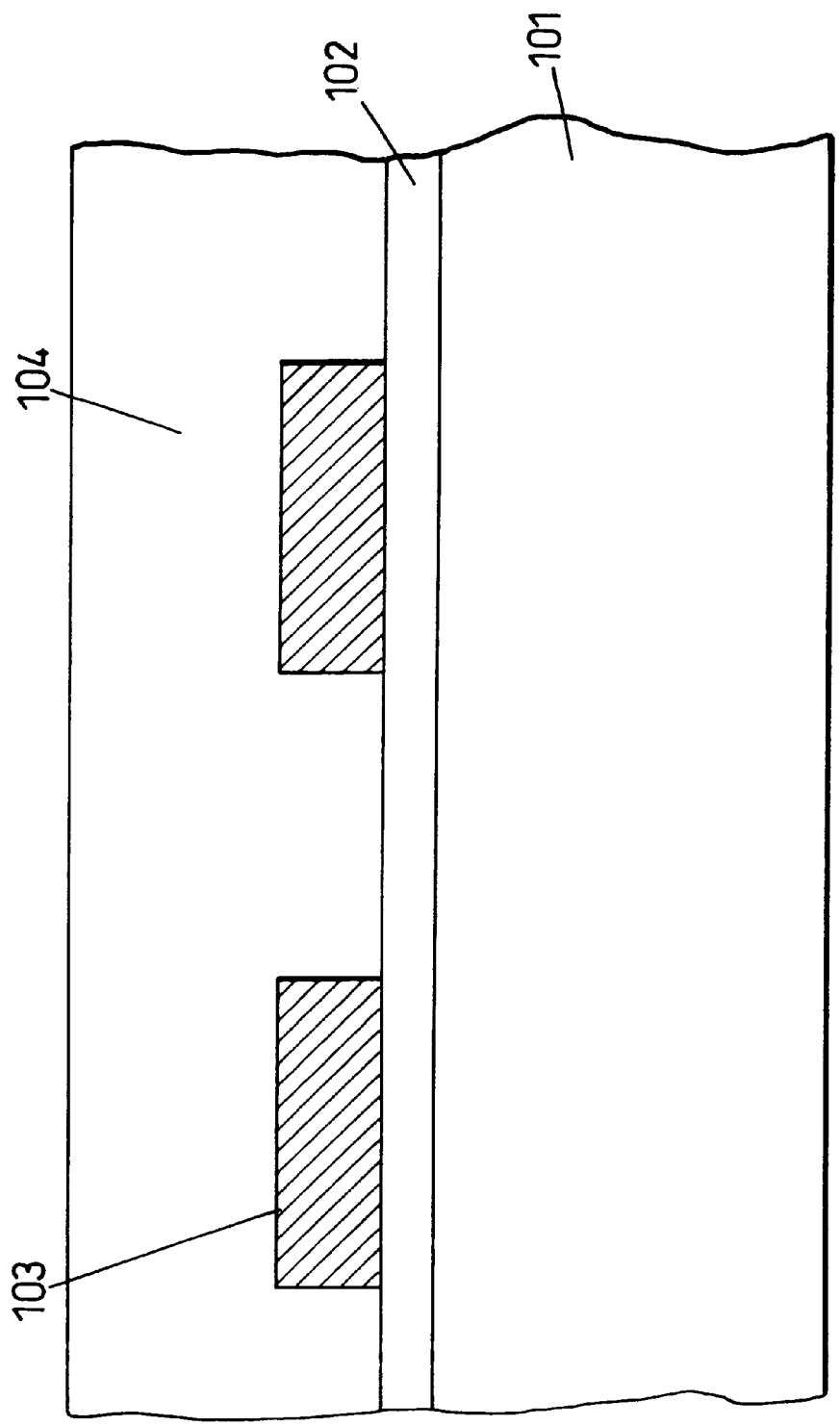
FIG. 1 is a cross-sectional view of a planar wave guide structure.

Referring first to FIG. 1, this shows by way of example a planar wave guide structure. The structure is disposed on a silicon substrate wafer 101 on which a silicon oxide buffer layer 102 is formed. This buffer layer may comprise thermally grown undoped oxide, or it may be a doped oxide layer formed by a chemical vapour deposition (CVD) process. The dopant may comprise e.g. boron, phosphorus or germania. Optical wave guide cores 103 are formed on the buffer layer 102 and are encapsulated in a planarising cladding layer 104. The cores 103 and the cladding layer will have been formed by a CVD process such as plasma enhanced chemical vapour deposition (PECVD). The relative dopant levels of the buffer layer, the cores and the cladding layer are such that the refractive index of the core material is greater than that of both the buffer and cladding layers. This ensures that the cores will have light guiding properties. Typically the core material is doped with germania and/or phosphorus and the cladding layer is doped with boron. Consolidation of the cladding layer is achieved by an annealing process as will be described below.

Figure 2:
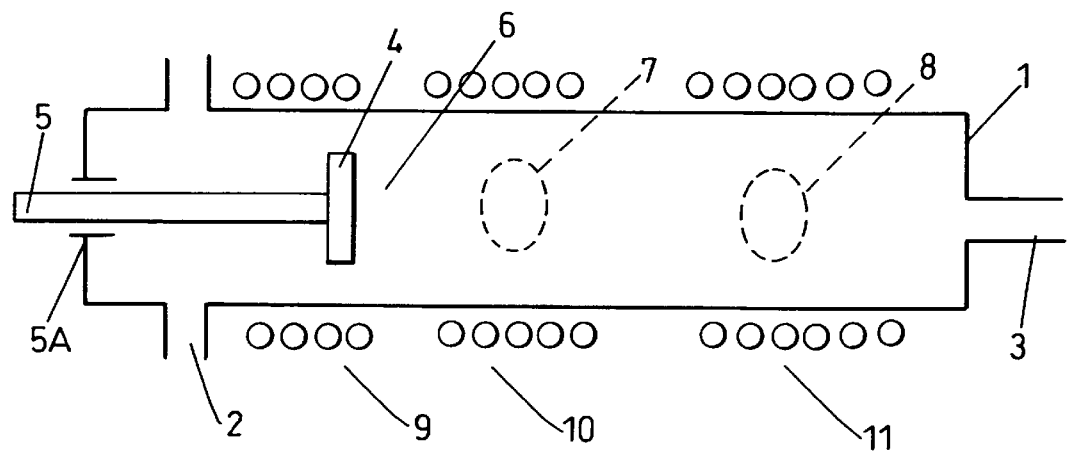
FIG. 2 shows a diagrammatic sectional view through a furnace having three communicating heating chambers.
Figure 3:
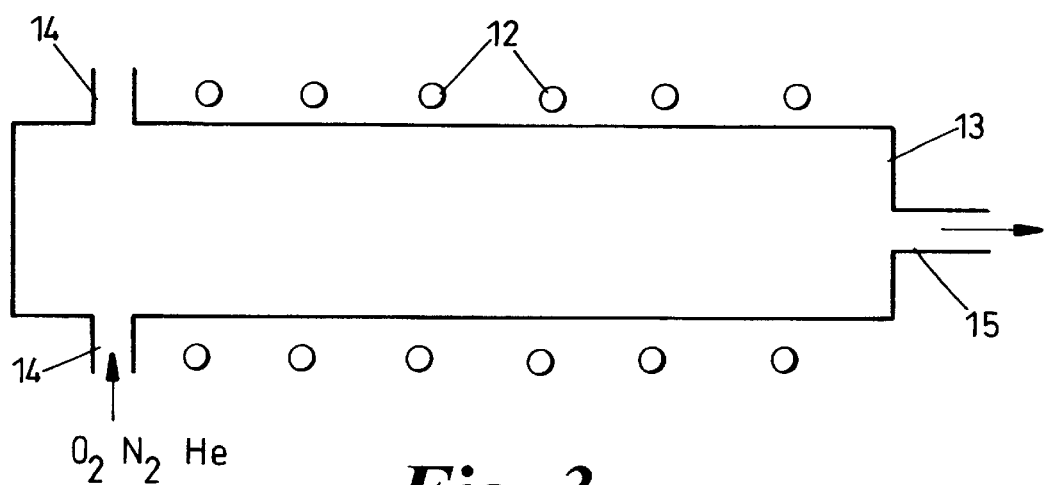
FIG. 3 shows a diagrammatic and cross-sectional view of a chamber heated by quartz-halogen lamps.

Referring now to FIGS. 2 and 3, the equipments depicted therein allow a substrate to be heated intensely for short periods, so called ramped heating. The FIG. 2 arrangement is suitable for heating small batches of for example 20 or so wafers at a time, and is a three stage furnace 1 having an inlet 2 at one end for scavenging gases, an exhaust exit conduit 3 at the other end, and a mobile wafer carrier 4 carried on a rod 5 which can be moved by the rod passing through a seal 5A between a cool site 6 at 900° C., an intermediate temperature site 7 at 1150° C. say, and a hot site 8 at 1225° C. for example. The differential heating may be provided by three heating coils 9, 10 and 11 of differing powers. Thus the wafers disposed in the furnace can be heated rapidly or ramped to 900° C. by their introduction to cool site 6, and then rapidly raised in temperature to 1225° C. by their transport on carrier 4 to hot site 8. The wafers can be rapidly cooled by oppositely transporting them, e.g. through the intermediate site with a short dwell period, to the cool site 6 and hence their removal leftward from the furnace chambers.

Alternatively wafers can be heated, one wafer at a time, in the quartz chamber 13 of FIG. 3, which has an input conduit 14 on one side for introducing inert gases, and an exit conduit 15 at the other end for extraction of the gases in continuous flow. Quartz chamber 13 does not absorb the radiation from quartz halogen lamps 12 immediately adjacent the chamber 13, and the wafers can be raised or cooled very rapidly in temperature, by control of the current through the lamps 12.

Both forms of heating are well-known, and the quartz halogen radiated heat is presently preferred.

In a first preferred process following the invention, a 15 microns thick silicon oxide buffer layer is deposited on a silicon wafer substrate, and, on the buffer layer is deposited a suitably doped silicon oxide core layer about six microns thick to form an optical wave guide. Both the buffer and core layers may deposited either by PECVD or LPCVD. In the PECVD process, the deposition is plasma activated at a moderately low sub-atmospheric pressure, e.g. of 500 millitorr, and at a temperature of about 300° C. If LPCVD is used, thermal activation plays more of a part in the dissociation of gases, i.e. the deposition may proceed at a lower sub-atmospheric pressure of 100 millitorr or so, and at a temperature of 400° to 700° C. A stress compensating layer may be deposited on the other face to the substrate in the case of PECVD deposition in a separate step, to prevent excessive bow of wafers such as thin silicon substrates by way of setting up a bowing tendency in the opposite sense, for instance when subjected to the really rapid thermal anneal at up to 1250° C. further referred to below. The LPCVD technique deposits films on both sides of the wafer simultaneously.

The preferred time and highest temperature of anneal depends on dopant concentrations in the buffer and core layers, but one of the key steps in annealing is an initial brief, typically 30 to 300 seconds, anneal at temperature of about 900° C., or so, for driving off bonded hydrogen (or other bonded gases) in the films.

After the initial pre-anneal step, the substrate temperature can be raised to a high temperature, as aforesaid appropriate to doping levels. It will be appreciated that the flow temperature of silicon oxide is determined by the dopant concentration. Typically, this high temperature is maintained for about 30 to 300 seconds, this being sufficient to permit flow of the material to achieve densification. For instance, in a structure comprising germania doped core layers on undoped buffer layers and having a refractive index difference of 0.001 (=1 OE-3), the substrate may be heated to 1,200° C. for 60 seconds in order to achieve a desired densification of the films. After such annealing, the wafers may be subjected to a standard etch by reactive ions (RIE), and cladding processes for defining specific planar wave guide devices such as an AWG (arrayed wave guide) demultiplexer. It will be appreciated that the total anneal time for a wafer having buffer, core and stress compensating layers, is reduced from the tens of hours typical for annealing in convention resistively heated furnaces, to one or two minutes when carried out by the above rapid thermal annealing.

Figure 4:
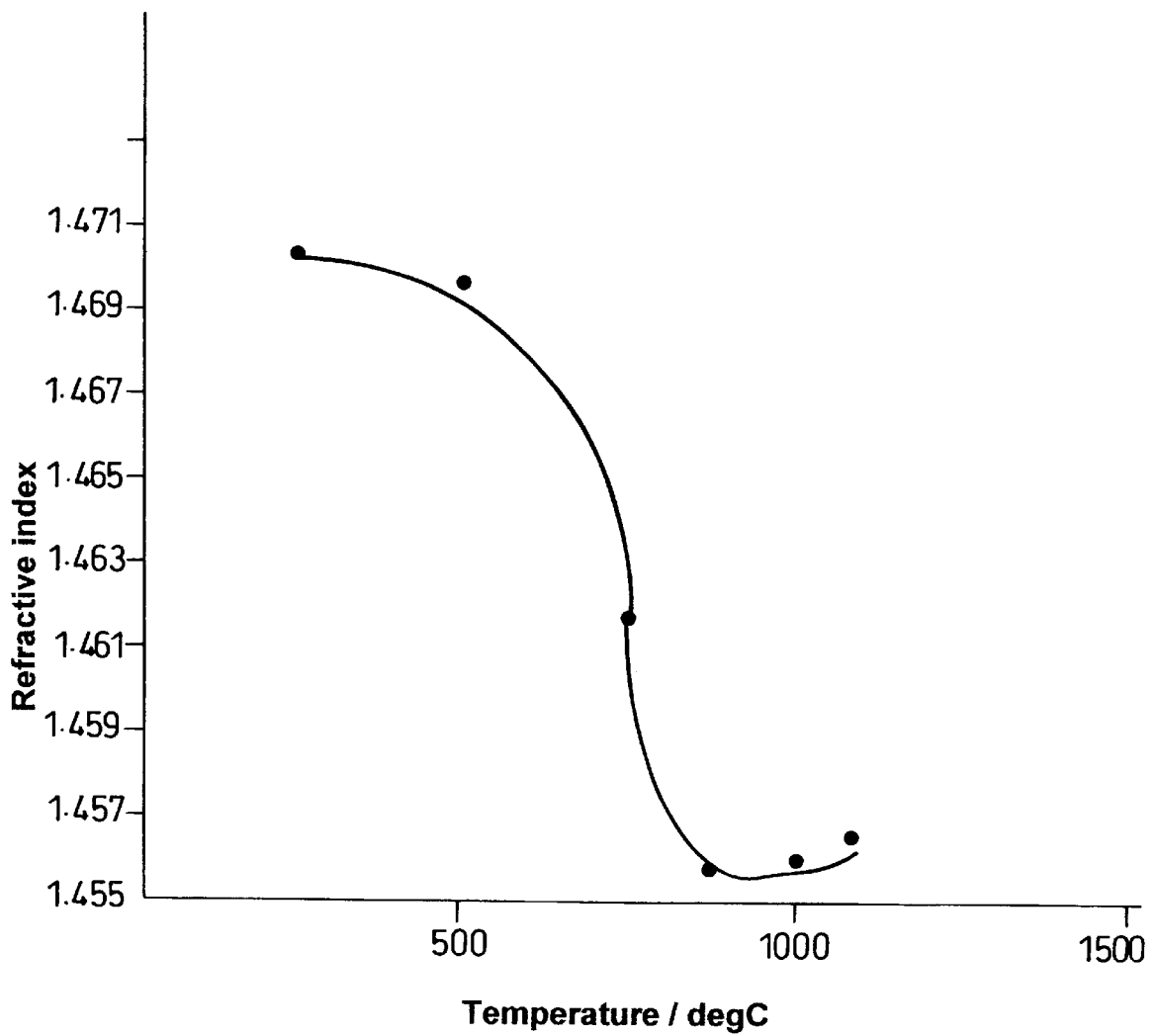
FIG. 4 is a graph illustrating the relationship between refractive index and temperature for a deposited silicon oxide layer.

Referring now to FIG. 4, this shows the effect of the annealing process on the refractive index of a PECVD deposited undoped silicon oxide film. The film was deposited at a temperature of 300° and the total anneal time was 60 seconds. Prior to annealing the hydrogen content of the film was measured at 2 at %. After the pre-annealing stage at 900° C. the hydrogen content was below the detection limit. As can be seen from FIG. 4, at low temperatures the material has a high refractive index as a result of the presence of bonded hydrogen. The index falls rapidly as the film is heated to the pre-annealing temperature of about 900° C. indicating the expulsion of this hydrogen. As the film is subsequently heated to the full annealing temperature of about 1100° C. the index rises slightly as a result of densification of the material.

In a second preferred rapid anneal process, the buffer layer is grown by thermal oxidation instead of PECVD or LPCVD. In this case a stress compensating layer is automatically produced on the back of the wafer by the steam oxidation, so that no specific steps need be undertaken to produce a compensating layer. The core layer can then be deposited over the buffer by PECVD or LPCVD as for the first embodiment.

A third preferred rapid anneal is based on the control of the nature and density of defects, and bonded hydrogen concentration, rather than their removal. The films deposited by PECVD or LPCVD or APCVD (i.e. chemical vapour deposition by plasma at atmospheric pressure) are typically deposited with the substrate subject to temperatures of 300°–400° C. The resulting films as deposited contain bonded hydrogen, and also can have some porosity and some structural and compositional defects. On annealing, these properties especially the nature and density of defects, and the hydrogen concentration in the films tend to change continually and progressively, depending on the heating and cooling rates and durations. The rapid thermal annealing techniques taught by the invention allow various fast and stepped ramping up and ramping down rates of temperature heating and cooling, from 10 to 200° C. per second up or down, with concomitant changes of optical properties such as photo-sensitivity to UV radiation enabling the above mentioned gradual control e.g. to some optimum. The enhancement of photo-sensitivity can assist in forming gratings on planar wave guide devices, thus making them more versatile in performance.

The planar wave guide structures prepare by the methods described above may comprise for example wavelength demultiplexers, power splitters and couplers or optical crosspoints.

I claim:

1. A method of fabricating a planar optical wave guide structure, the method comprising:

forming an oxide buffer layer on a major surface of a silicon wafer substrate;

forming by plasma enhanced chemical vapour deposition at least one vitreous silicon oxide optical wave guide core on said buffer layer, said core(s) being doped to increase its(their) refractive index above that of said buffer layer;

depositing by plasma enhanced chemical vapour deposition a doped vitreous silicon oxide planarising cladding layer over said core(s) and buffer layer so as to provide a substantially planar surface, said cladding layer having a refractive index less than that of said core(s); and annealing the structure including the cladding layer by heating the structure to a first temperature of 840 to 930° C., said first temperature being below a flow temperature of the cladding layer, in a pre-annealing step long enough to drive off bonded volatile materials from the cladding layer, and subsequently heating the structure to a second temperature of 1150 to 1250° C., said second temperature being close to or above the flow temperature of the cladding layer, in a final heating step so as to consolidate and anneal the cladding layer, and allowing the structure to return to ambient temperature.

2. A method as claimed in claim 1 wherein, in the pre-annealing step, the substrate is maintained at about 900° C., for a period of 30 to 300 seconds.

3. A method as claimed in claim 2 wherein the substrate is maintained at said second temperature for a period of 30 to 300 seconds.

4. A method as claimed in claim 3, wherein said core(s) is(are) doped with germania and said cladding layer is doped with boron.

\* \* \* \* \*